US010566761B2

United States Patent
Miura et al.

(10) Patent No.: US 10,566,761 B2
(45) Date of Patent: Feb. 18, 2020

(54) SEMICONDUCTOR LASER MODULE

(71) Applicant: FURUKAWA ELECTRIC CO., LTD., Tokyo (JP)

(72) Inventors: Masakazu Miura, Tokyo (JP); Jun Miyokawa, Tokyo (JP); Kazuki Yamaoka, Tokyo (JP); Toshio Kimura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/867,833

(22) Filed: Jan. 11, 2018

(65) Prior Publication Data

US 2018/0138657 A1    May 17, 2018

Related U.S. Application Data

(63) Continuation of application No. PCT/JP2016/071049, filed on Jul. 15, 2016.
(Continued)

(51) Int. Cl.
*G02B 6/42* (2006.01)
*H01S 5/022* (2006.01)
*H01S 5/024* (2006.01)

(52) U.S. Cl.
CPC ........ *H01S 5/02252* (2013.01); *G02B 6/4206* (2013.01); *G02B 6/4245* (2013.01);
(Continued)

(58) Field of Classification Search
None
See application file for complete search history.

(56) References Cited

U.S. PATENT DOCUMENTS 4,807,956 A * 2/1989 Tournereau .......... G02B 6/4202
250/227.11
5,016,965 A * 5/1991 Marshall .............. G02B 6/4202
385/35
(Continued)

FOREIGN PATENT DOCUMENTS

CN     102362401 A    2/2012
JP     09-325247      12/1997
(Continued)

OTHER PUBLICATIONS

English translation of written opinion for PCT/JP2016/071049, dated Sep. 13, 2016.*
(Continued)

*Primary Examiner* — Michael Stahl
(74) *Attorney, Agent, or Firm* — Oblon, McClelland, Maier & Neustadt, L.L.P.

(57) ABSTRACT

A semiconductor laser module includes a semiconductor laser that outputs laser light; an optical fiber that guides the laser light; a lens that couples the laser light, which is output from the semiconductor laser, with the optical fiber; a base that is substantially tabular in shape and that has the semiconductor laser, the optical fiber, and the lens fixed thereon either directly or indirectly; and a housing which houses the base and fixes the base either directly or indirectly. Among faces of the base, a face on a side that is fixed either directly or indirectly to the housing includes a junction plane that is joined to the housing either directly or indirectly, and a detachment plane that is detached to remain unfixed from the housing.

5 Claims, 8 Drawing Sheets

Related U.S. Application Data

(60) Provisional application No. 62/193,287, filed on Jul. 16, 2015.

(52) U.S. Cl.
CPC ........ *G02B 6/4265* (2013.01); *H01S 5/02288* (2013.01); *H01S 5/02216* (2013.01); *H01S 5/02284* (2013.01); *H01S 5/02415* (2013.01); *H01S 5/02438* (2013.01)

(56) References Cited

U.S. PATENT DOCUMENTS

| | | | |
|---|---|---|---|
| 5,068,865 A * | 11/1991 | Ohshima | G02B 6/4207 372/36 |
| 6,720,582 B2 | 4/2004 | Miyokawa et al. | |
| 6,734,517 B2 | 5/2004 | Miyokawa et al. | |
| 7,030,422 B2 | 4/2006 | Miyokawa et al. | |
| 7,585,117 B2 * | 9/2009 | Kaneko | G02B 6/12007 385/14 |
| 8,475,056 B2 | 7/2013 | Yalamanchili et al. | |
| 9,036,678 B2 | 5/2015 | Raju et al. | |
| 2001/0004369 A1 * | 6/2001 | Miyokawa | G02B 6/4201 372/36 |
| 2002/0003819 A1 | 1/2002 | Kimura et al. | |
| 2002/0005522 A1 | 1/2002 | Miyokawa et al. | |
| 2002/0009106 A1 | 1/2002 | Miyokawa et al. | |
| 2002/0048297 A1 * | 4/2002 | Irie | G02B 6/4208 372/36 |
| 2004/0028098 A1 | 2/2004 | Miyokawa et al. | |
| 2009/0252188 A1 * | 10/2009 | Rossi | H01S 5/02415 372/34 |
| 2011/0026558 A1 | 2/2011 | Raju et al. | |

FOREIGN PATENT DOCUMENTS

| | | |
|---|---|---|
| JP | 2002-050824 | 2/2002 |
| JP | 2002-116355 A | 4/2002 |
| JP | 2002-333554 | 11/2002 |

OTHER PUBLICATIONS

International Search Report dated Sep. 13, 2016 in PCT/JP2016/071049 filed on Jul. 15, 2016 (with English Translation).
Written Opinion dated Sep. 13, 2016 in PCT/JP2016/071049 filed on Jul. 15, 2016.
The extended European search report dated Apr. 10, 2019 in corresponding EP Application No. 16824550.4 (11 pages).
Chinese Office Action dated Sep. 17, 2019 in Chinese Patent Application No. 201680041553.9, with concise English translation.

* cited by examiner

SEMICONDUCTOR LASER MODULE

CROSS-REFERENCE TO RELATED APPLICATION(S)

This application is based on a continuation of International Application No. PCT/JP2016/071049, filed on Jul. 15, 2016 which claims the benefit of priority of U.S. provisional Application No. 62/193,287, filed on Jul. 16, 2015, the entire contents of which are incorporated herein by reference.

BACKGROUND

The present disclosure relates to a semiconductor laser module.

In recent years, semiconductor lasers (laser diodes) have been in use in large quantity as signal light sources or as excitation light sources of optical fiber amplifiers in optical communication. In the case of using a semiconductor laser as a signal light source or an excitation light source in optical communication, the semiconductor laser is often configured as a semiconductor laser module in which the laser light coming from the semiconductor laser is optically coupled with an optical fiber and then the laser light is output via the optical fiber.

Typically, a semiconductor laser module includes a semiconductor laser; an optical fiber; and a lens (that is sometimes configured in an integrated manner on an end face of the optical fiber) for optically coupling the laser light, which is output from the semiconductor laser, with the optical fiber. Moreover, the semiconductor laser module sometimes includes auxiliary components such as an isolator and a diode. In the semiconductor laser module, the constituent elements are housed inside a housing while being fixed onto one or more bases (for example, see Japanese Laid-open Patent Publication No. 2002-333554).

SUMMARY

There is a need for providing a semiconductor laser module capable of suppressing deterioration in the optical performance attributed to the variation in temperature.

According to an embodiment, a semiconductor laser module includes: a semiconductor laser that outputs laser light; an optical fiber that guides the laser light; a lens that couples the laser light, which is output from the semiconductor laser, with the optical fiber; a base that is substantially tabular in shape and that has the semiconductor laser, the optical fiber, and the lens fixed thereon either directly or indirectly; and a housing which houses the base and fixes the base either directly or indirectly. Further, among faces of the base, a face on a side that is fixed either directly or indirectly to the housing includes a junction plane, which is joined to the housing either directly or indirectly, and a detachment plane, which is detached to remain unfixed from the housing.

DETAILED DESCRIPTION

The base on which the constituent elements of a semiconductor laser module are fixed sometimes undergoes deformation due to the variation in temperature. In the semiconductor laser module, the variation in temperature is caused, for example, due to the variation in the ambient temperature or due to the heat generated as a result of supplying electrical current for driving the semiconductor laser. Moreover, there are times when the temperature is proactively varied using a Peltier element with the aim of controlling the emission wavelength. The deformation of the base attributed to the variation in temperature causes an error in the positional relationship among the constituent elements disposed on the base, and leads to deterioration in the optical performance of the semiconductor laser module such as deterioration in the coupling efficiency between the semiconductor laser and the optical fiber.

Exemplary embodiments of a semiconductor laser module according to the present disclosure are described below in detail with reference to the accompanying drawings. However, the present disclosure is not limited to the embodiments described below.

First Embodiment

Figure 1:
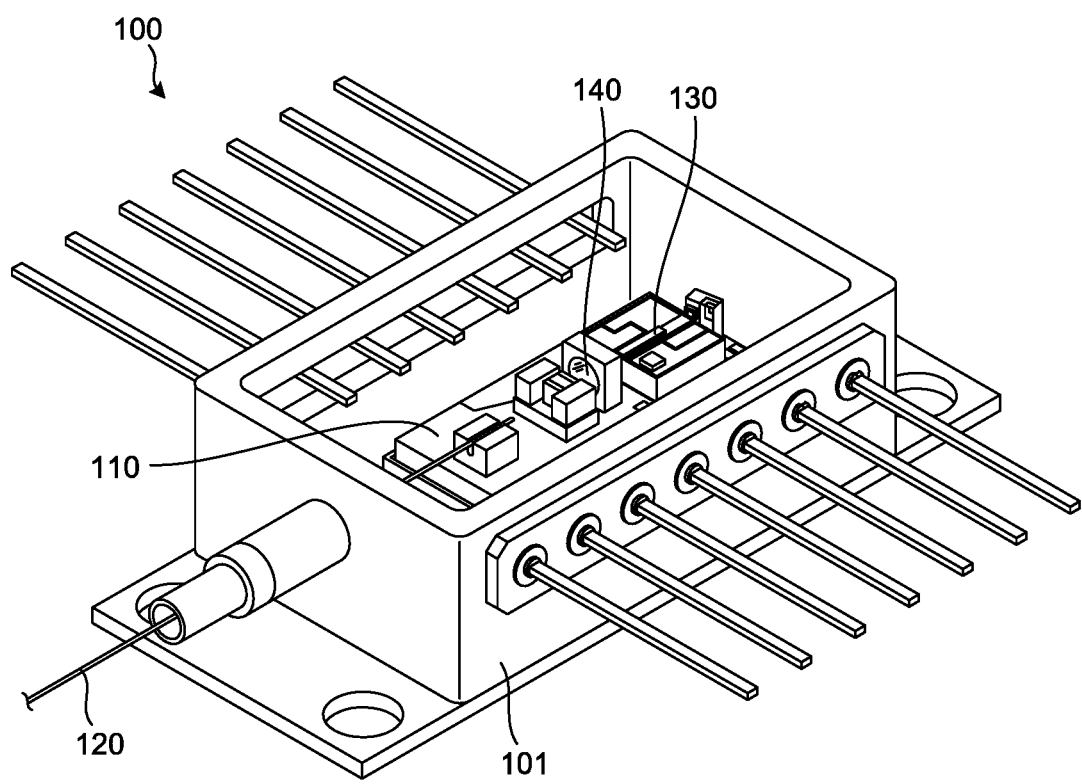
FIG. 1 is a perspective view illustrating an overall configuration of a semiconductor laser module according to a first embodiment.

FIG. 1 is a perspective view illustrating an overall configuration of a semiconductor laser module according to a first embodiment. As illustrated in FIG. 1, a semiconductor laser module 100 according to the first embodiment includes a semiconductor laser 130 that outputs laser light; an optical fiber 120 that guides the laser light; a lens 140 that couples the laser light, which is output from the semiconductor laser 130, with the optical fiber 120; a base 110 that is substantially tabular in shape and that has the semiconductor laser 130, the optical fiber 120, and the lens 140 fixed thereon either directly or indirectly; and a housing 101 in which the base 110 is housed and is fixed either directly or indirectly.

In the semiconductor laser module 100, the laser light output from the semiconductor laser 130 is coupled with the optical fiber 120 via the lens 140 and propagates through the optical fiber 120, before being derived from the housing 101 of the semiconductor laser module 100. Meanwhile, the housing 101 illustrated in FIG. 1 is, what is called, a butterfly-type housing. Moreover, generally, in a portion of the housing 101 from which the optical fiber 120 is derived, a protective boot is attached to prevent breakage of the optical fiber 120. At the time of using the semiconductor laser module 100, the housing 101 is covered with an upper lid. However, in FIG. 1, the upper lid is omitted for the purpose of illustrating the internal structure.

Figure 2:
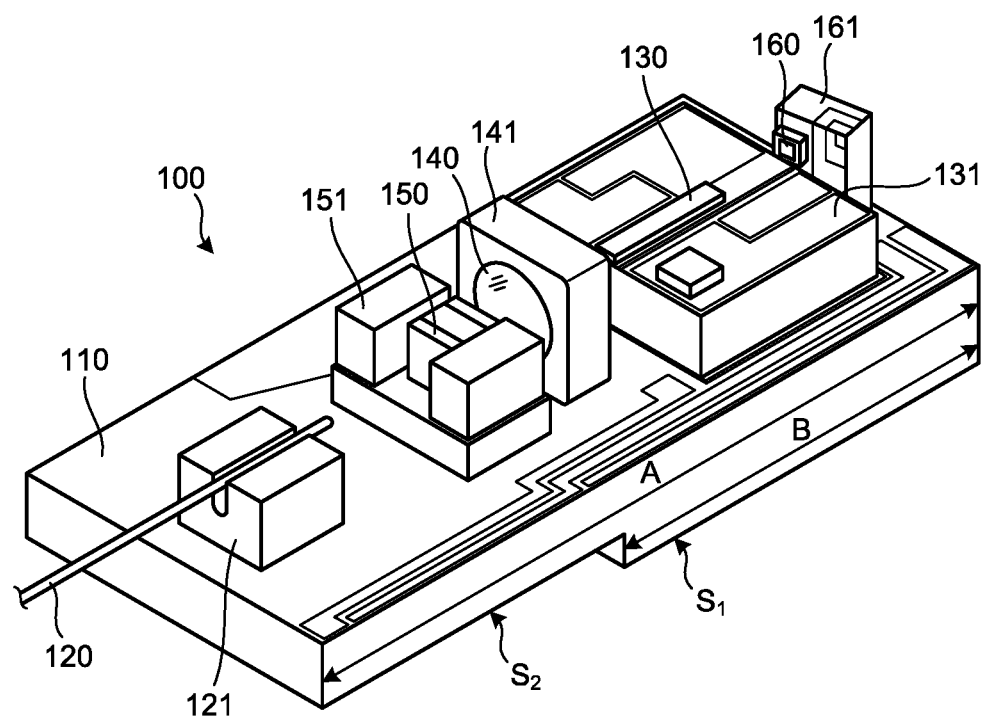
FIG. 2 is a perspective view of a base and constituent elements disposed on the base according to the first embodiment.

With reference to FIG. 2, explained is a configuration of the base 110 in the semiconductor laser module 100 according to the first embodiment along with the constituent elements disposed on the base 110. FIG. 2 is a perspective view of the base and the constituent elements disposed on the base according to the first embodiment.

As illustrated in FIG. 2, the base 110 in the semiconductor laser module 100 is substantially tabular in shape. Herein, the face on which various constituent elements such as the semiconductor laser 130 are disposed is assumed to be the front face, and the face on the opposite side of the front face is assumed to be the rear face.

On the front face of the base 110, the semiconductor laser 130 is indirectly fixed via a semiconductor laser mount (also called a "sub-mount") 131; the optical fiber 120 is indirectly fixed via an optical fiber fixture 121; and the lens 140 is indirectly fixed via a mirror frame 141. Moreover, on the front face of the base 110, an isolator 150 is indirectly fixed via an isolator mount 151; and a photodiode 160 is indirectly fixed via a photodiode holder 161. Meanwhile, the semiconductor laser mount 131 is meant for aligning the path of the laser light at a predetermined height. Thus, if the front face of the base 110 is configured to have asperity with the aim of aligning the path of the laser light at a predetermined height, then the constituent elements can be directly fixed to the front face of the base 110.

As illustrated in FIG. 2, in the semiconductor laser module 100, the laser light output from the semiconductor laser 130 is coupled with the optical fiber 120 via the lens 140 and the isolator 150. The lens 140 is used to focus the laser light, which is output from the semiconductor laser 130, onto the incidence end face of the optical fiber 120. The isolator 150 is an optical element configured to allow the passage of the laser light output from the semiconductor laser 130 toward the optical fiber but not to allow the passage of the laser light output from the optical fiber 120 toward the semiconductor laser 130, and thus has the function of protecting the semiconductor laser 130 from the laser light travelling backward. The photodiode 160 detects the intensity of the laser light that is output to the posterior side of the semiconductor laser 130 (i.e., output in the opposite direction of the lens 140). The detection result of the photodiode 160 is used in calculating the intensity of the laser light that is output from the semiconductor laser module 100.

As illustrated in FIG. 2, the base 110 is a tabular member having a step difference between a junction plane $S_1$ and a detachment plane $S_2$. As far as the material of the base 110 is concerned, it is possible to use aluminum nitride (AlN), for example. Alternatively, it is also possible to use some other material such as ceramic, metal, resin, or glass as the material of the base 110.

As a result of manufacturing the base 110 from a single plate, it becomes possible to reduce the number of components. In a two-plate configuration, since a junction plane is formed in the base, the soldering layer used as the junction material at the junction plane may obstruct heat transfer thereby leading to defects attributed to the junction plane. In contrast, since the base 110 according to the first embodiment is made of a single plate, there are no defects attributed to the junction plane.

As illustrated in FIG. 2, of the faces of the base 110, the rear face includes the junction plane $S_1$ that is joined to the housing 101 (illustrated in FIG. 1) either directly or indirectly, and further includes the detachment plane $S_2$ that remains detached to remain unfixed from the housing 101. Although described in detail later in the explanation of a verification experiment, if the detachment plane $S_2$ that is not fixed to the housing 101 is formed in at least some part of the rear face of the base 110, it becomes possible to achieve the effect of suppressing the deterioration in the optical performance of the semiconductor laser module attributed to the variation in temperature. However, for example, the ratio or the percentage between the junction plane $S_1$ and the detachment plane $S_2$ on the rear face of the base 110 can be set to adapt to the configuration in the following manner.

The semiconductor laser 130 is a heat source and can be subjected to wavelength control by varying the temperature. Thus, it is desirable that the semiconductor laser 130 is disposed in such an area on the front face of the base 110 which is opposite to the junction plane $S_1$. If the direction from the semiconductor layer 130 toward the optical fiber 120 is defined as the anterior direction, then the semiconductor laser 130 is positioned on the posterior side of the base 110 as illustrated in FIG. 2. Thus, it is desirable that the junction plane $S_1$ is positioned on the posterior side of the rear face of the base 110, and it is desirable that the detachment plane $S_2$ is positioned on the anterior side of the rear face of the base 110. More particularly, it is desirable that a predetermined percentage of the rear face from the rear end of the base 110 is treated as the junction plane $S_1$, and it is desirable that the remaining part of the rear face is treated as the detachment plane $S_2$. When A represents the length in the front-back direction of the base 110 and when B represents the length in the front-back direction of the junction plane $S_1$, the predetermined percentage is the numerical value defined by B/A. In the following explanation, the numerical value defined by B/A is called the percentage of the junction plane.

Moreover, it is desirable that the lens 140 also is disposed in such an area on the front face of the base 110 which is opposite to the junction plane $S_1$.

Meanwhile, as illustrated in FIG. 2, in the base 110 according to the first embodiment, the optical fiber fixture 121 is disposed in the area opposite to the detachment plane $S_2$.

Figure 3:
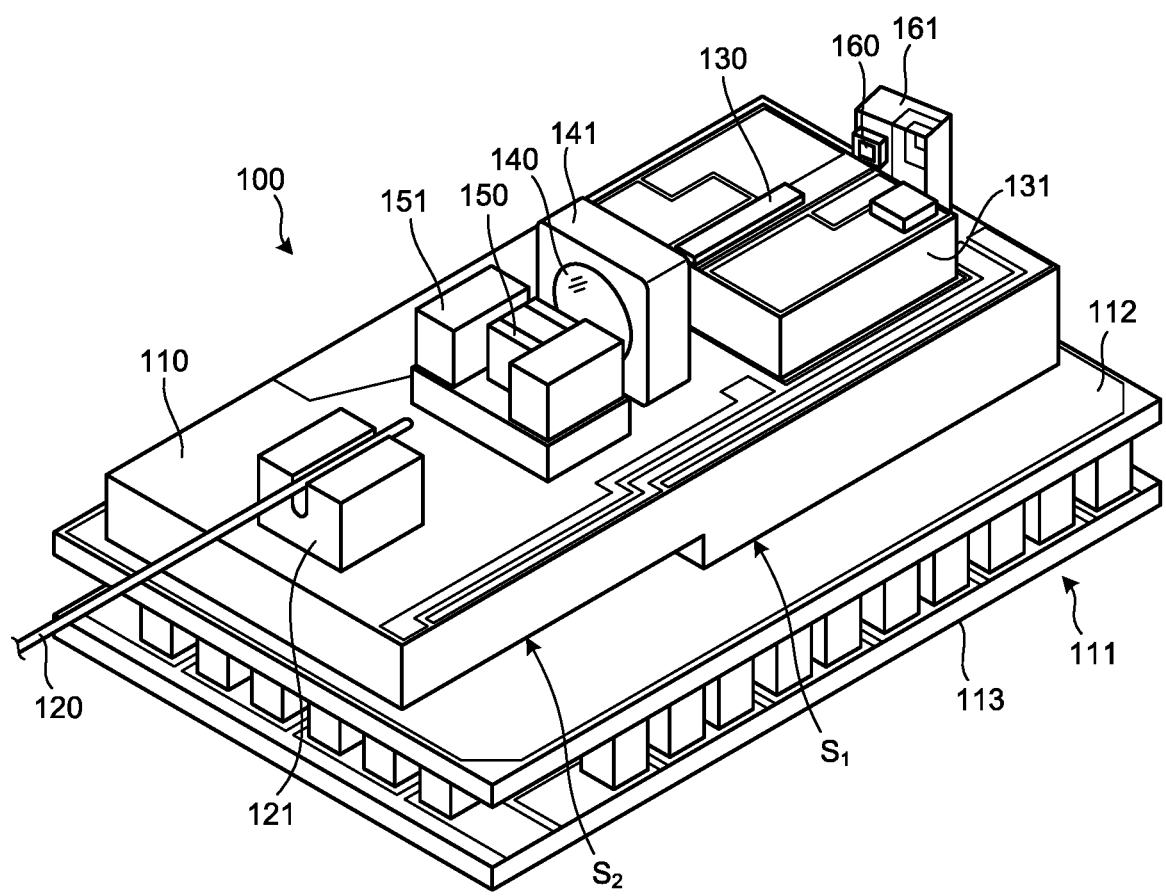
FIG. 3 is a perspective view illustrating the state in which the base according to the first embodiment is joined to a Peltier element.

FIG. 3 is a perspective view illustrating the state in which the base according to the first embodiment is joined to a Peltier element. In the semiconductor laser module 100 according to the first embodiment, note that a configuration without a Peltier element is not ruled out. However, as a particularly preferred configuration, a configuration of the semiconductor laser module 100 is explained with reference to FIG. 3. As illustrated in FIG. 3, the base 110 is fixed on a Peltier element 111. The Peltier element 111 is a tabular semiconductor device which makes use of the Peltier effect indicating that, when electrical current is supplied to the junction area of two types of metals, there is heat transfer from one metal to the other metal. The Peltier element 111 is configured in such a way that there is a temperature difference between an upper plate 112 and a lower plate 113 thereof. In the first embodiment, the upper plate 112 is joined to the junction plane $S_1$ of the base 110. On the other hand, the upper plate 112 of the Peltier element 111 remains separated from the detachment plane $S_2$. Meanwhile, although not illustrated in FIG. 3, the lower plate 113 of the Peltier element 111 is joined to the bottom face of the housing 101 (illustrated in FIG. 1). The temperature difference between the upper plate 112 and the lower plate 113 of the Peltier element 111 is dependent on the direction of the electrical current supplied to the Peltier element 111 and thus the plus or minus value of the temperature difference can be inversed. That is, the Peltier element 111 can ensure that the heat transfers from the upper plate 112 to the lower plate 113 or can ensure that the heat transfers from the lower plate 113 to the upper plate 112. As described earlier, since the semiconductor laser 130 disposed on the base 110 is a heat source, the Peltier element 111 is typically used to ensure that the heat transfers from the upper plate 112 to the lower plate 113. However, since there can be a situation where the ambient temperature on the outside of the housing 101 is higher than the target temperature of the semiconductor laser 130, and therefore, the heat transfer is not necessarily carried out from the upper plate 112 to the lower plate 113.

The Peltier element 111 is known to have the following properties. Because of a temperature difference between the upper plate 112 and the lower plate 113, the Peltier element 111 is strained. If the lower plate 113 has a higher temperature than the upper plate 112, the heat expansion of the lower plate 113 is greater than the heat expansion of the upper plate 112. Hence, the Peltier element 111 is warped to the side of the upper plate 112.

On the other hand, if the upper plate 112 has a higher temperature than the lower plate 113, the heat expansion of the upper plate 112 is greater than the heat expansion of the lower plate 113. Hence, the Peltier element 111 is warped to the side of the lower plate 113.

In the base 110 according to the first embodiment, on the rear face of the base 110, the detachment plane $S_2$ is formed in at least some part in a detached manner to remain unfixed from the Peltier element 111. Hence, even if the Peltier element 111 is strained, the effect of the strain is prevented from extending to the strain of the base 110. Particularly, in the base 110 according to the first embodiment, since the optical fiber fixture 121 is disposed in such an area on the front face of the base 110 which is opposite to the detachment plane $S_2$, there is not much impact of the strain of the Peltier element 111 and thus the position shift of the optical fiber 120, which is held by the optical fiber fixture 121, is also suppressed to a small amount. On the other hand, as described earlier, the semiconductor laser 130 is disposed in such an area on the front face of the base 110 which is opposite to the junction plane $S_1$. Hence, the heat generated in the semiconductor laser 130 can be efficiently exhausted via the junction plane $S_1$. That is, as a result of using the base 110 having the abovementioned configuration, not only it is possible to adequately perform the temperature control of the semiconductor laser 130, but it is also possible to suppress the deterioration in the optical performance attributed to the heat change.

Meanwhile, in the configuration example illustrated in FIG. 3, the base 110 is indirectly fixed to the housing 101 (see FIG. 1) via the Peltier element 111. However, the application of the first embodiment is not limited to the configuration example illustrated in FIG. 3, and the configuration can alternatively be such that the junction plane $S_1$ of the base 110 is directly joined to the housing 101. That is because, even if the Peltier element 111 is not used, there may be cases where the housing 101 itself gets subjected to thermal strain; and, even if the junction plane $S_1$ of the base 110 is joined to the bottom face of the housing 101 while keeping the detachment plane $S_2$ and the housing 101 separated from each other, not only the heat generated in the semiconductor laser 130 can be adequately exhausted but also the deterioration in the optical performance attributed to the heat change is suppressed.

Verification Experiment

Figure 4:
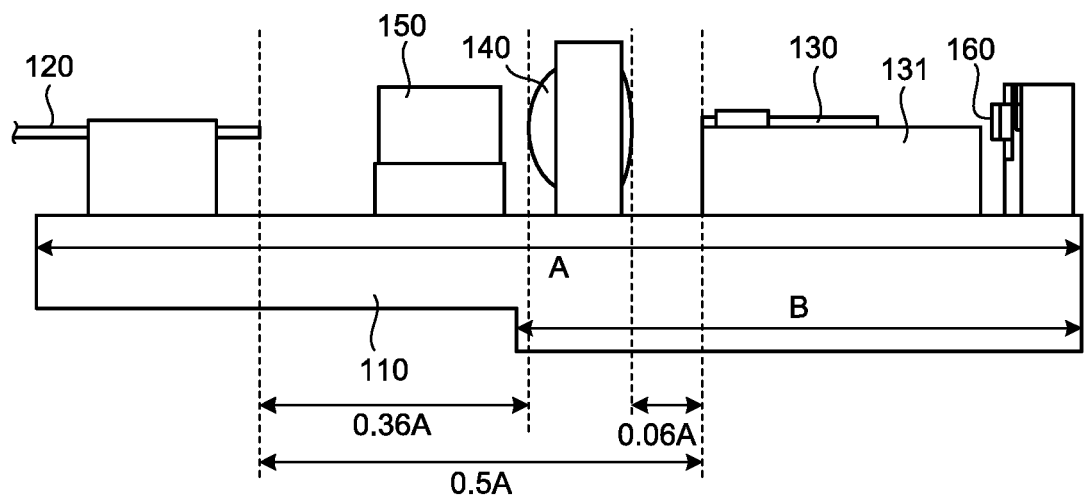
FIG. 4 is a diagram illustrating structural parameters of the base used in a verification experiment.

Given below is the explanation of a verification experiment that is performed by using the configuration according to the first embodiment and that is performed regarding the changes in the optical performance attributed to the heat change in the semiconductor laser module 100. FIG. 4 is a diagram illustrating structural parameters of the base 110 used in the verification experiment. The numeral values illustrated in FIG. 4 represent the ratio with the length A in the front-back direction of the base 110.

Thus, in the base 110 used in the verification experiment, the radiation end face of the semiconductor laser 130 and the incidence end face of the optical fiber 120 have the distance of 0.5 A mm. Moreover, the radiation end face of the semiconductor laser 130 and the incidence end face of the lens 140 have the distance of 0.06 A mm; and the radiation end face of the lens 140 and the incidence end face of the optical fiber 120 have the distance of 0.36 A mm.

As illustrated in FIG. 4, the base 110 used in the verification experiment has the length A in the front-back direction thereof, and the junction plane has the length B in the front-back direction. That is, the percentage of the junction plane is equal to B/A. The thickness of the base 110, which is used in the verification experiment, can be set to an arbitrary thickness because of the reason described below.

Figure 5:
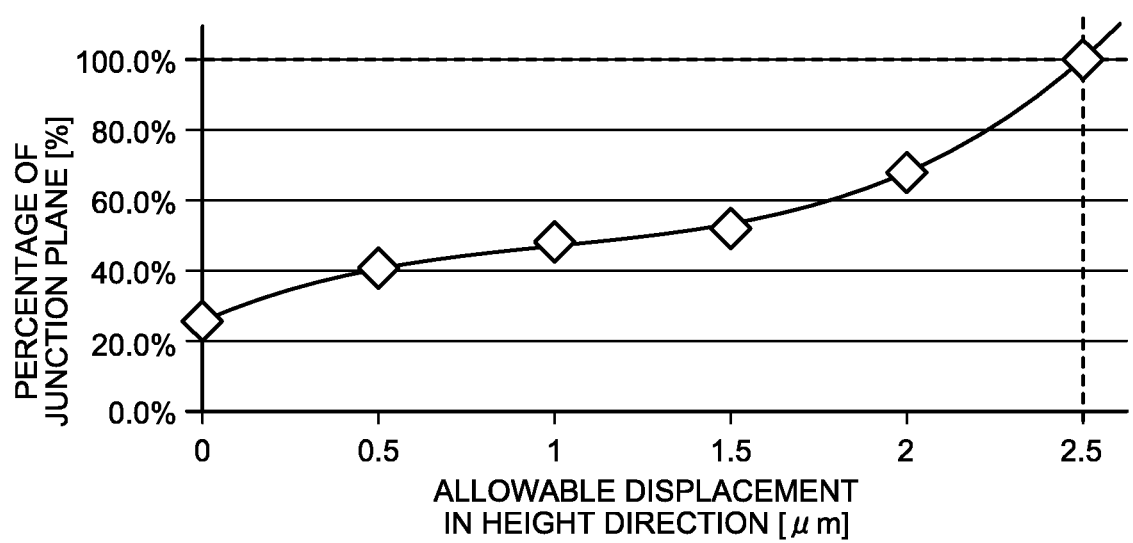
FIG. 5 is a graph indicating a relationship between the allowable displacement in the height direction and percentage of a junction plane.

FIG. 5 is a graph indicating the relationship between the allowable displacement in the height direction and the percentage of the junction plane. The graph illustrated in FIG. 5 is plotted as the relationship between the allowable displacement in the height direction and the percentage of the junction plane $S_1$ under the assumption that the base 110 has the thickness of 0 mm.

The displacement in the height direction implies the displacement in the height of the optical fiber 120 with reference to the height of the semiconductor laser 130. As illustrated in FIG. 4, essentially, the semiconductor laser 130 and the optical fiber 120 are designed to have identical heights (with no displacement). Thus, the displacement in the height direction provides the scale related to the coupling efficiency at the time of coupling the laser light, which is output from the semiconductor laser 130, with the optical fiber 120; and the allowable displacement in the height direction is decided according to the demanded coupling efficiency.

The condition of temperature applied in the verification experiment is as follows. It is assumed that the temperature on the outside of the housing 101 of the semiconductor laser module 100 is cooled to −25° C. and, in that environment, the Peltier element 111 is so controlled that the temperature of the semiconductor laser 130 is maintained at 25° C. That is, in this verification experiment, there is a temperature difference of approximately 50° C. between the upper plate 112 and the lower plate 113 of the Peltier element 111.

Meanwhile, the base 110 is assumed to have the thickness of 0 mm because of the following reason. As is easily inferred, the greater the thickness of the base 110 becomes, the smaller the displacement in the height direction becomes. Conversely, the smaller the thickness of the base 110 becomes, the greater the displacement in the height direction becomes. Thus, in the case where the base 110 has the thickness of 0 mm, the displacement in the height direction gives the worst value of the displacement in the height direction. That is, even if it is not possible to have the thickness of 0 mm in the actual base 110, as a result of evaluating the worst value that can be theoretically present, the verification result illustrated in FIG. 5 indicates that the relationship between the percentage of the junction plane and the allowable displacement in the height direction (without dependence on the thickness of the base 110) is verified.

As can be read from the graph illustrated in FIG. 5, when the allowable displacement in the height direction is equal to or smaller than 2.5 mm, the percentage of the junction plane $S_1$ can be set to be lower than 100%. The state in which the percentage of the junction plane S1 is 100% indicates that B/A=100% and implies that the base 110 does not have any detachment plane that is detached to remain unfixed from the housing 101. That is, when the percentage of the junction plane $S_1$ is 100%, which indicates the shape of a conventional base. However, in the base 110 according to the first embodiment, on the rear face of the base 110, if the detachment plane $S_2$ is formed in at least some part in a detached manner to remain unfixed from the housing 101; then it can be understood that the deterioration in the optical performance of the semiconductor laser module as attributed to the variation in temperature can be suppressed. For example, if the percentage of the junction plane $S_1$ is set to be equal to or lower than 90%, then the allowable displacement in the height direction improves to be equal to or smaller than 2.3 mm. Hence, a significant effect is achieved as compared to the shape of a conventional base.

On the other hand, as can be read from the graph illustrated in FIG. 5, even if the allowable displacement in the height direction is 0 mm, it is sufficient if the percentage (ratio) of the junction plane $S_1$ to the sum of the junction plane $S_1$ and the detachment plane $S_2$ is set to be 25%. Thus, the percentage of the junction plane $S_1$ can be set to 25% as the lower limit.

Moreover, as can be read from the graph illustrated in FIG. 5, in the range from 40% or higher to 68% or lower of the percentage of the junction plane $S_1$, the slope of the graph is gentle. This means that, when the percentage of the junction plane $S_1$ is varied, the allowable displacement in the height direction sharply responds to the variation. Thus, this means that, in the range from 40% or higher to 68% or lower of the percentage (ratio) of the junction plane $S_1$ to the sum of the junction plane $S_1$ and the detachment plane $S_2$, the effect of suppressing the deterioration in the optical performance of the semiconductor laser module as attributed to the variation in temperature is especially conspicuous.

Second Embodiment

Figure 6:
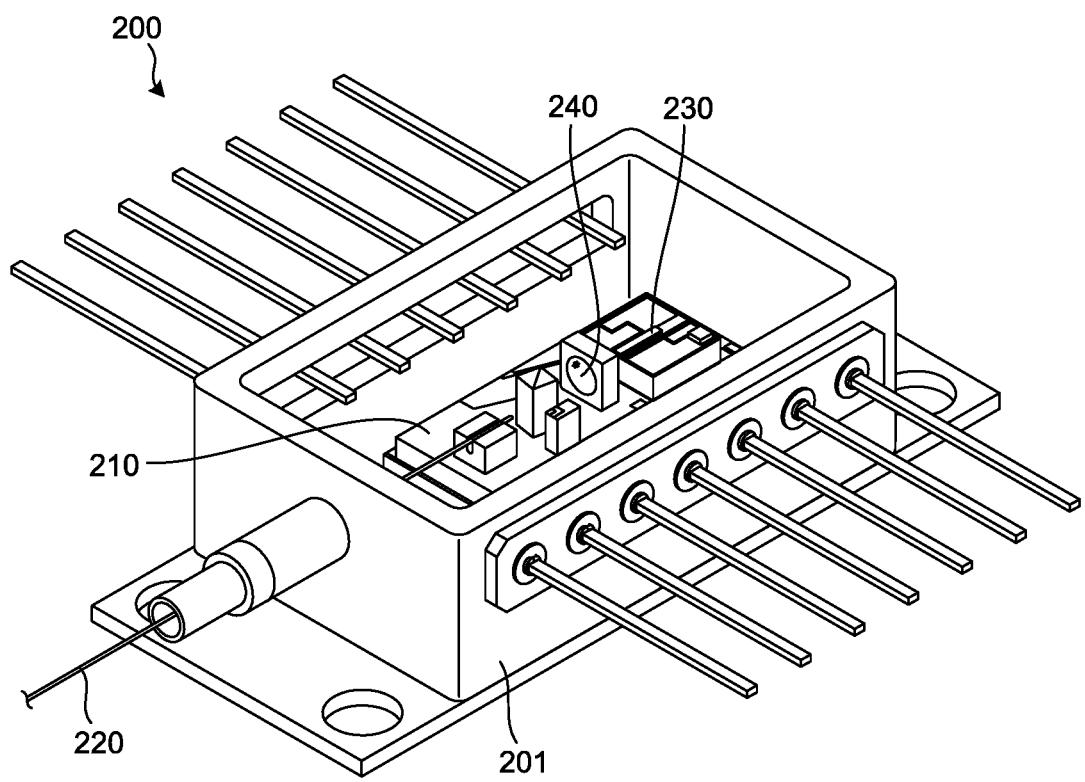
FIG. 6 is a perspective view illustrating an overall configuration of a semiconductor laser module according to a second embodiment.

FIG. 6 is a perspective view illustrating an overall configuration of a semiconductor laser module according to a second embodiment. As illustrated in FIG. 6, a semiconductor laser module 200 according to the second embodiment includes a semiconductor laser 230 that outputs laser light; an optical fiber 220 that guides the laser light; a lens 240 that couples the laser light, which is output from the semiconductor laser 230, with the optical fiber 220; a base 210 that is substantially tabular in shape and that has the semiconductor laser 230, the optical fiber 220, and the lens 240 fixed thereon either directly or indirectly; and a housing 201 in which the base 210 is housed and is fixed either directly or indirectly. In an identical manner to the first embodiment, in the semiconductor laser module 200 too, the laser light output from the semiconductor laser 230 is coupled with the optical fiber 220 via the lens 240 and propagates through the optical fiber 220, before being derived from the housing 201 of the semiconductor laser module 200.

Figure 7:
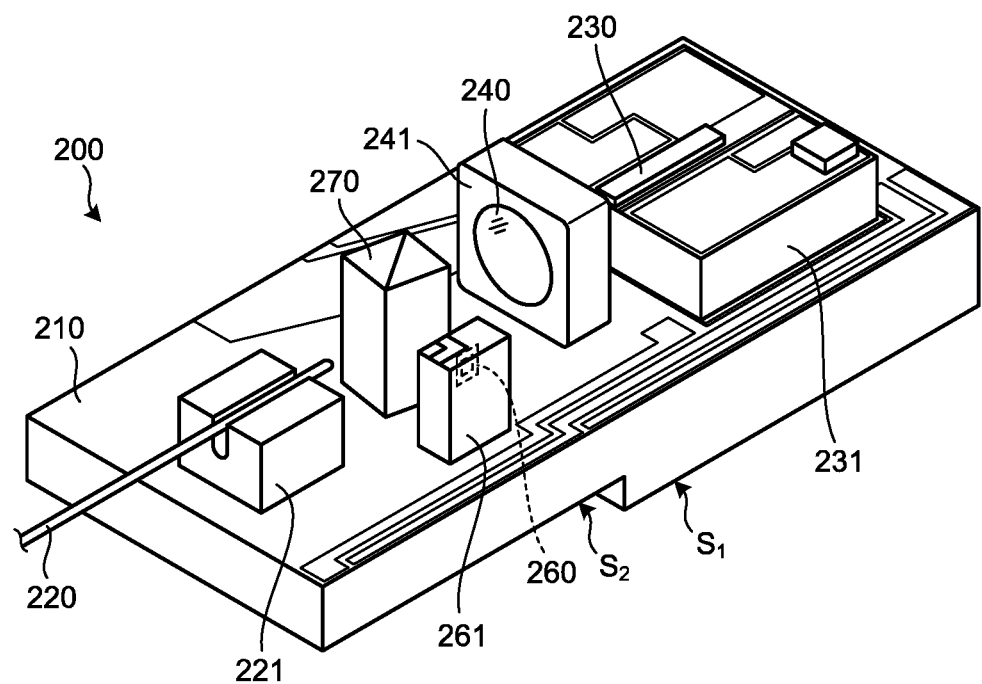
FIG. 7 is a perspective view of a base and constituent elements disposed on the base according to the second embodiment.

FIG. 7 is a perspective view of the base and the constituent elements disposed on the base according to the second embodiment. As illustrated in FIG. 7, the base 210 in the semiconductor laser module 200 is substantially tabular in shape. Herein, the definitions of the front face and the rear face are identical to the definitions according to the first embodiment.

On the front face of the base 210, the semiconductor laser 230 is indirectly fixed via a semiconductor laser mount 231; the optical fiber 220 is indirectly fixed via an optical fiber fixture 221; and the lens 240 is indirectly fixed via a mirror frame 241. Moreover, on the front face of the base 210, a beam splitter 270 is directly fixed; and a photodiode 260 is indirectly fixed via a photodiode holder 261.

As illustrated in FIG. 7, in the semiconductor laser module 200, the laser light output from the semiconductor laser 230 is coupled with the optical fiber 220 via the lens 240 and the beam splitter 270. Herein, the difference from the first embodiment is that some of the laser light that passes through the beam splitter 270 splits toward the photodiode 260, and the intensity of the laser light detected at the photodiode 260 is used in calculating the intensity of the laser light output from the semiconductor laser module 200.

As illustrated in FIG. 7, in an identical manner to the first embodiment, the base 210 is a tabular member having a step difference between the junction plane $S_1$ and the detachment plane $S_2$. Moreover, the material usable as the base 210 is also identical to the first embodiment. Of the faces of the base 110, the rear face includes the junction plane $S_1$ that is joined to the housing 201 (illustrated in FIG. 6) either directly or indirectly, and includes the detachment plane $S_2$ that is detached to remain unfixed from the housing 201. As illustrated in FIG. 3, the base 210 either can be indirectly joined to the housing 201 via a Peltier element or can be directly joined to the housing 201 without using a Peltier element. In the configuration including a Peltier element, the impact of deformation of the Peltier element, which is attributed to the temperature difference between the upper plate and the lower plate of the Peltier element, is suppressed. In the configuration not including a Peltier element, the impact of the thermal strain on the housing 201 itself is suppressed.

As illustrated in FIG. 7, it is desirable that the semiconductor laser 230 is disposed in such an area on the front face of the base 210 which is opposite to the junction plane $S_1$. Moreover, it is desirable that the lens 240 is also disposed in such an area on the front face of the base 210 which is opposite to the junction plane $S_1$. Furthermore, as far as the desirable percentage of the junction plane $S_1$ in the base 210 is concerned, it is possible to use the same numerical values as the first embodiment.

In the semiconductor laser module 200 too, since the semiconductor laser 230 is disposed in such an area on the front face of the base 210 which is opposite to the junction plane $S_1$, the heat generated in the semiconductor laser 230 can be efficiently exhausted via the junction plane $S_1$. On the other hand, since the optical fiber fixture 221 is disposed in such an area on the front face of the base 210 which is opposite to the detachment plane $S_2$, there is only a small amount of deformation attributed to the variation in temperature. Thus, as a result of using the base 210 having the abovementioned configuration, not only it is possible to adequately perform the temperature control of the semiconductor laser 230, but also it is possible to suppress the deterioration in the optical performance attributed to the heat change.

Third Embodiment

In the explanation of a third embodiment, a perspective view illustrating an overall configuration of a semiconductor laser module is omitted, and the explanation is given only about a base and the constituent elements disposed on the base. Herein, although not explained with reference to a particular drawing, the semiconductor laser module according to the third embodiment too includes a semiconductor laser that outputs laser light; an optical fiber that guides the laser light; a lens that couples the laser light, which is output from the semiconductor laser, with the optical fiber; a base that is substantially tabular in shape and that has the semiconductor laser, the optical fiber, and the lens fixed thereon either directly or indirectly; and a housing in which the base is housed and is fixed either directly or indirectly. The laser light output from the semiconductor laser is coupled with the optical fiber via the lens and propagates through the optical fiber, before being derived from the housing of the semiconductor laser module.

Figure 8:
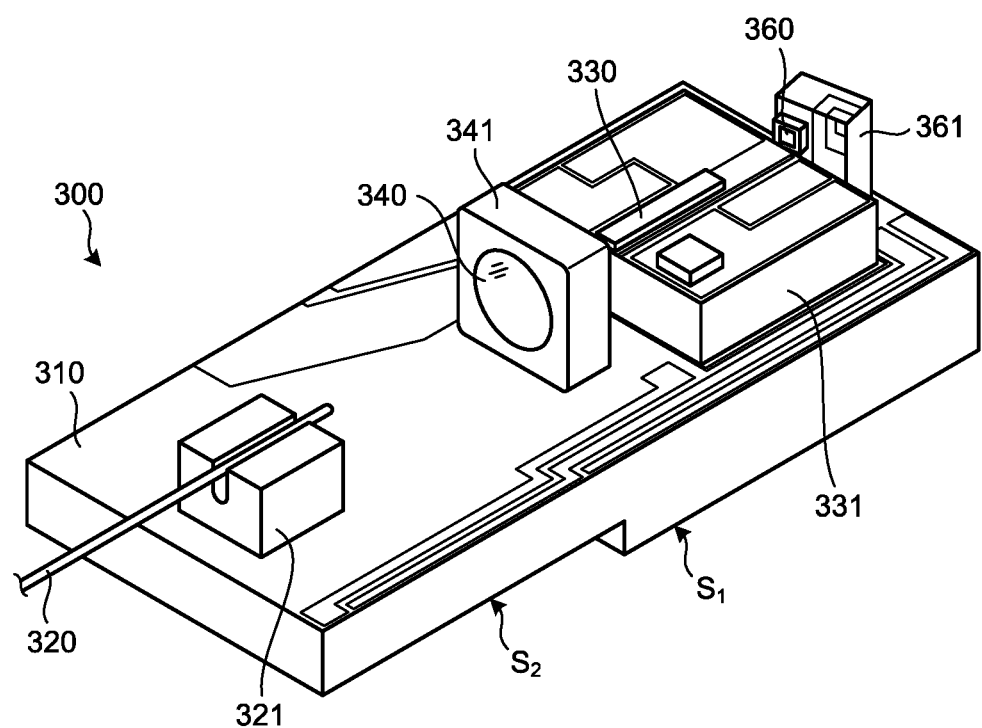
FIG. 8 is a perspective view of a base and constituent elements disposed on the base according to a third embodiment.

FIG. 8 is a perspective view of the base and of the constituent elements disposed on the base according to the third embodiment. As illustrated in FIG. 8, a base 310 in a semiconductor laser module 300 is substantially tabular in shape. Herein, the definitions of the front face and the rear face are identical to the definitions according to the first embodiment.

On the front face of the base 310, a semiconductor laser 330 is indirectly fixed via a semiconductor laser mount 331; an optical fiber 320 is indirectly fixed via an optical fiber fixture 321; and a lens 340 is indirectly fixed via a mirror frame 341. Moreover, on the front face of the base 310, a photodiode 360 is indirectly fixed via a photodiode holder 361.

As illustrated in FIG. 8, in the semiconductor laser module 300, the laser light output from the semiconductor laser 330 is coupled with the optical fiber 320 via the lens 340. Herein, the difference from the first embodiment is that no isolator is disposed.

As illustrated in FIG. 8, in an identical manner to the first embodiment, the base 310 is a tabular member having a step difference between the junction plane $S_1$ and the detachment plane $S_2$. Moreover, the material usable as the base 310 is also identical to that in the first embodiment. Of the faces of the base 310, the rear face includes the junction plane $S_1$ that is joined to the housing either directly or indirectly, and includes the detachment plane $S_2$ that is detached to remain unfixed from the housing. As illustrated in FIG. 3, the base 310 either can be indirectly joined to the housing via a Peltier element or can be directly joined to the housing without using a Peltier element. In the configuration including a Peltier element, the impact of deformation of the Peltier element, which is attributed to the temperature difference between the upper plate and the lower plate of the Peltier element, is suppressed. In the configuration not including a Peltier element, the impact of the thermal strain on the housing itself is suppressed.

As illustrated in FIG. 8, it is desirable that the semiconductor laser 330 is disposed in such an area on the front face of the base 310 which is opposite to the junction plane $S_1$. Moreover, it is desirable that the lens 340 is also disposed in such an area on the front face of the base 310 which is opposite to the junction plane $S_1$. Furthermore, as far as the desirable percentage of the junction plane $S_1$ in the base 310 is concerned, it is possible to use the same numerical values as the first embodiment.

In the semiconductor laser module 300 too, since the semiconductor laser 330 is disposed in such an area on the front face of the base 310 which is opposite to the junction plane $S_1$, the heat generated in the semiconductor laser 330 can be efficiently exhausted via the junction plane $S_1$. On the other hand, since the optical fiber fixture 321 is disposed in such an area on the front face of the base 310 which is opposite to the detachment plane $S_2$, there is only a small amount of deformation attributed to the variation in temperature. Thus, as a result of using the base 310 having the abovementioned configuration, not only it is possible to adequately perform the temperature control of the semiconductor laser 330, but it is also possible to suppress the deterioration in the optical performance attributed to the heat change.

Herein, although the present disclosure is described with reference to the abovementioned embodiments for a complete and clear disclosure, the appended claims are not to be thus limited but are to be construed as embodying all modifications and alternative constructions that may occur to one skilled in the art that fairly fall within the basic teaching herein set forth.

INDUSTRIAL APPLICABILITY

The semiconductor laser module according to the present disclosure is capable of suppressing the deterioration in the optical performance attributed to the variation in temperature.

As described above, the semiconductor laser module according to the present disclosure is useful in optical communication.

The invention claimed is:

1. A semiconductor laser module comprising:
   a semiconductor laser that outputs laser light;
   an optical fiber that guides the laser light;
   a lens that couples the laser light, which is output from the semiconductor laser, with the optical fiber;
   a base that is substantially tabular in shape and that has each of the (i) semiconductor laser, (ii) the optical fiber, and (iii) the lens fixed thereon either directly or indirectly; and
   a housing which houses the base and fixes the base either directly or indirectly, wherein
      the optical fiber is disposed on an opposite side of the semiconductor laser with respect to the lens,
      a rear face of the base that is on a side that is fixed either directly or indirectly to the housing includes (i) a junction plane, which is joined to the housing either directly or indirectly, and (ii) a detachment plane, which is detached to remain unfixed from the housing,
      the lens is fixed on a front face of the base in an area that is opposite to the junction plane, and
      the base is a tabular member having a step difference between the junction plane and the detachment plane.

2. The semiconductor laser module according to claim 1, wherein the semiconductor laser is disposed in an area on a front face of the base that is opposite to the junction plane.

3. The semiconductor laser module according to claim 1, further comprising a Peltier element that is configured such that there is a temperature difference between an upper plate and a lower plate thereof, wherein
   the base is indirectly fixed to the housing via the Peltier element such that the upper plate is joined to the junction plane and the lower plate is joined to the housing.

4. The semiconductor laser module according to claim 1, wherein a ratio of a length of the junction plane to a length that is a sum of the length of the junction plane and a length of the detachment plane, is 25% or higher and 90% or lower.

5. The semiconductor laser module according to claim 1, wherein a ratio of a length of the junction plane to a length that is a sum of the length of the junction plane and a length of the detachment plane, is 40% or higher and 68% or lower.

\* \* \* \* \*